(12) United States Patent
Matsumoto et al.

(10) Patent No.: US 12,486,570 B2
(45) Date of Patent: Dec. 2, 2025

(54) FILM FORMING METHOD AND FILM FORMING APPARATUS

(71) Applicant: Tokyo Electron Limited, Tokyo (JP)

(72) Inventors: Takashi Matsumoto, Nirasaki (JP); Ryota Ifuku, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 29 days.

(21) Appl. No.: 18/002,312

(22) PCT Filed: Jun. 11, 2021

(86) PCT No.: PCT/JP2021/022251
§ 371 (c)(1),
(2) Date: Dec. 19, 2022

(87) PCT Pub. No.: WO2021/261289
PCT Pub. Date: Dec. 30, 2021

(65) Prior Publication Data
US 2023/0257871 A1   Aug. 17, 2023

(30) Foreign Application Priority Data

Jun. 25, 2020   (JP) .................................. 2020-109733

(51) Int. Cl.
C23C 16/26   (2006.01)
C01B 32/186   (2017.01)
C23C 16/455   (2006.01)
C23C 16/511   (2006.01)

(52) U.S. Cl.
CPC ............ *C23C 16/26* (2013.01); *C01B 32/186* (2017.08); *C23C 16/45542* (2013.01); *C23C 16/511* (2013.01)

(58) Field of Classification Search
None
See application file for complete search history.

(56) References Cited

U.S. PATENT DOCUMENTS

| 2008/0153311 | A1* | 6/2008 | Padhi ..................... C23C 16/56 |
| | | | 257/E21.27 |
| 2016/0017484 | A1* | 1/2016 | Kikuchi ............ H01J 37/32357 |
| | | | 427/569 |
| 2019/0085457 | A1* | 3/2019 | Ifuku ................. H01L 21/02425 |
| 2020/0354829 | A1* | 11/2020 | Song ................. H01L 23/53276 |
| 2021/0280420 | A1* | 9/2021 | Bhuyan ................... C23C 16/26 |

FOREIGN PATENT DOCUMENTS

| CN | 103121670 A | * | 5/2013 |
| JP | 2017-533347 A | | 11/2017 |
| JP | 2019-055887 A | | 4/2019 |
| KR | 10-2009-0093975 A | | 9/2009 |
| WO | 2021168134 A1 | | 8/2021 |

* cited by examiner

*Primary Examiner* — Jose I Hernandez-Kenney
(74) *Attorney, Agent, or Firm* — Armstrong Teasdale LLP

(57) ABSTRACT

A film forming method includes a first step of supplying a first aromatic hydrocarbon gas having a first functional group to a substrate provided with an underlayer film, and a second step of activating the first aromatic hydrocarbon gas adsorbed on a surface of the underlayer film by plasma of a first reaction gas that contains at least a rare gas.

13 Claims, 13 Drawing Sheets

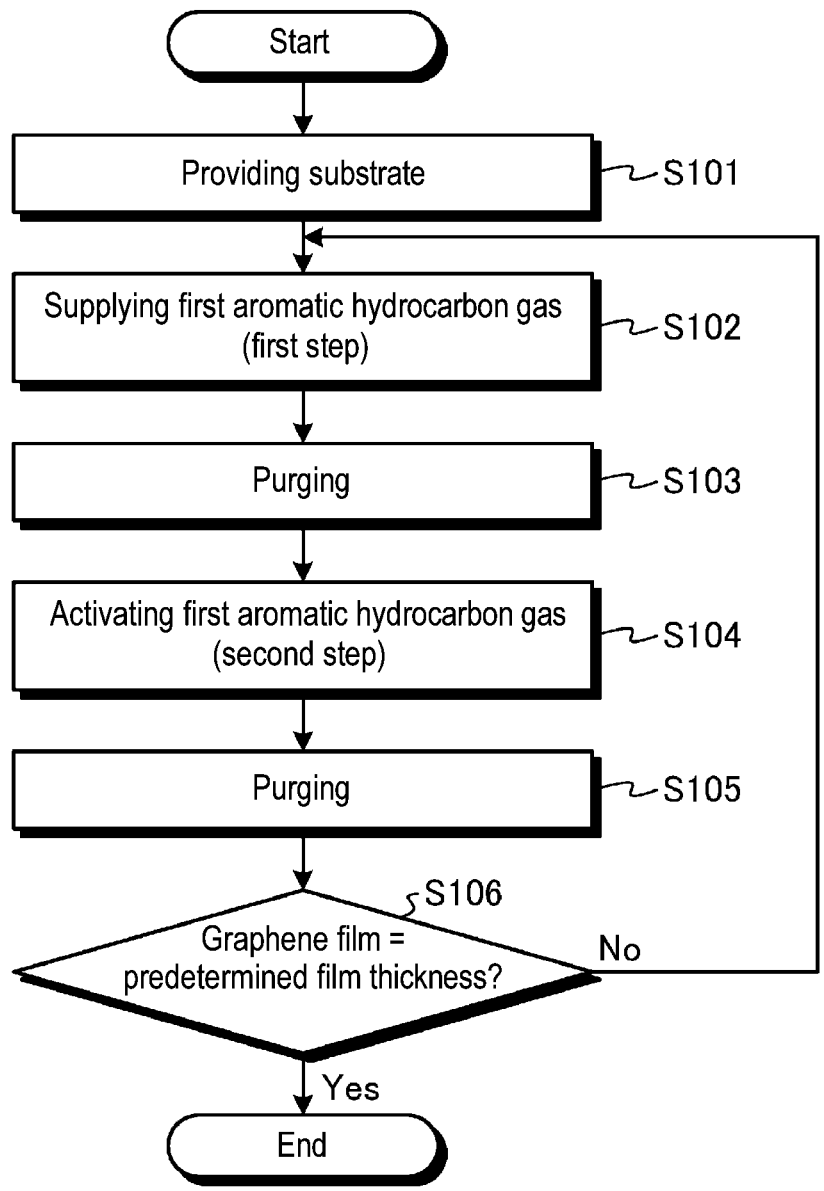

FIG. 2A  FIG. 2B  FIG. 2C
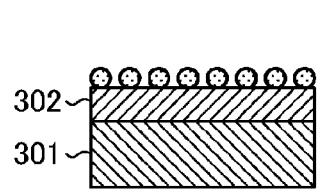
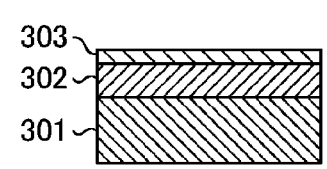
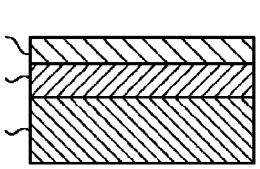
FIG. 3
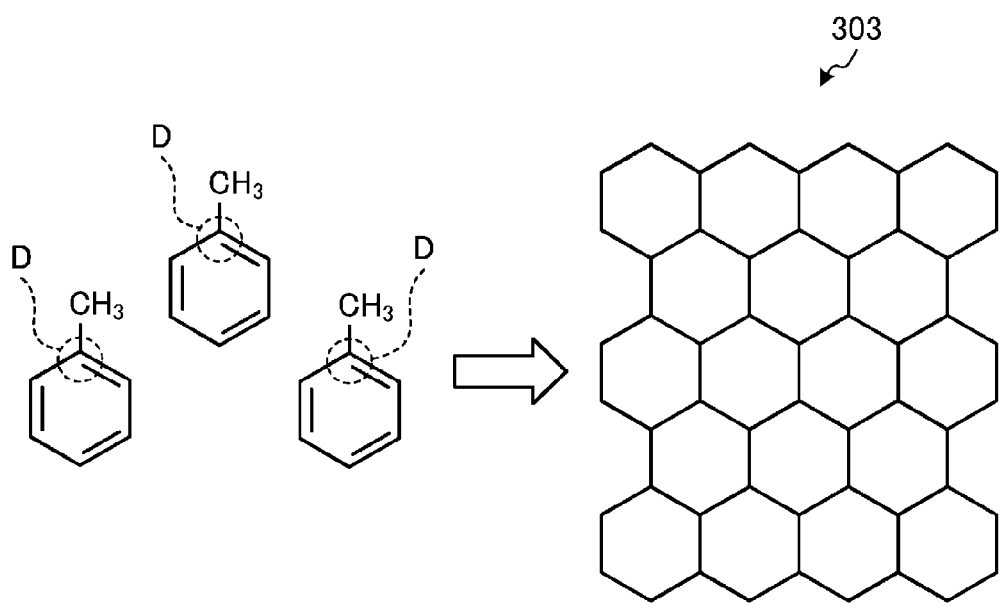

FILM FORMING METHOD AND FILM FORMING APPARATUS

TECHNICAL FIELD

The present disclosure relates to a film forming method and a film forming apparatus.

BACKGROUND

Conventionally, there is a technique of forming a carbon film on a substrate such as a semiconductor wafer (hereinafter also referred to as a "wafer") by using a plasma chemical vapor deposition (CVD) method.

PRIOR ART DOCUMENT

Patent Document

Patent Document 1: Japanese laid-open publication No. 2019-55887

The present disclosure provides a technique capable of efficiently forming a carbon film in a low-temperature environment.

SUMMARY

A film forming method according to an aspect of the present disclosure includes a first step of supplying a first aromatic hydrocarbon gas having a first functional group to a substrate provided with an underlayer film, and a second step of activating the first aromatic hydrocarbon gas adsorbed on a surface of the underlayer film by plasma of a first reaction gas that contains at least a rare gas.

According to the present disclosure, it is possible to efficiently form a carbon film in a low-temperature environment.

BRIEF DESCRIPTION OF DRAWINGS

FIG. 1 is a flowchart illustrating an example of the flow of a film forming method according to an embodiment.

FIGS. 2A to 2C are views for describing an example of a graphene film formed by the film forming method according to the embodiment.

FIG. 3 is a view for describing an example of a mechanism for promoting growth of a graphene film formed by the film forming method according to the embodiment.

DETAILED DESCRIPTION

Figure 4:
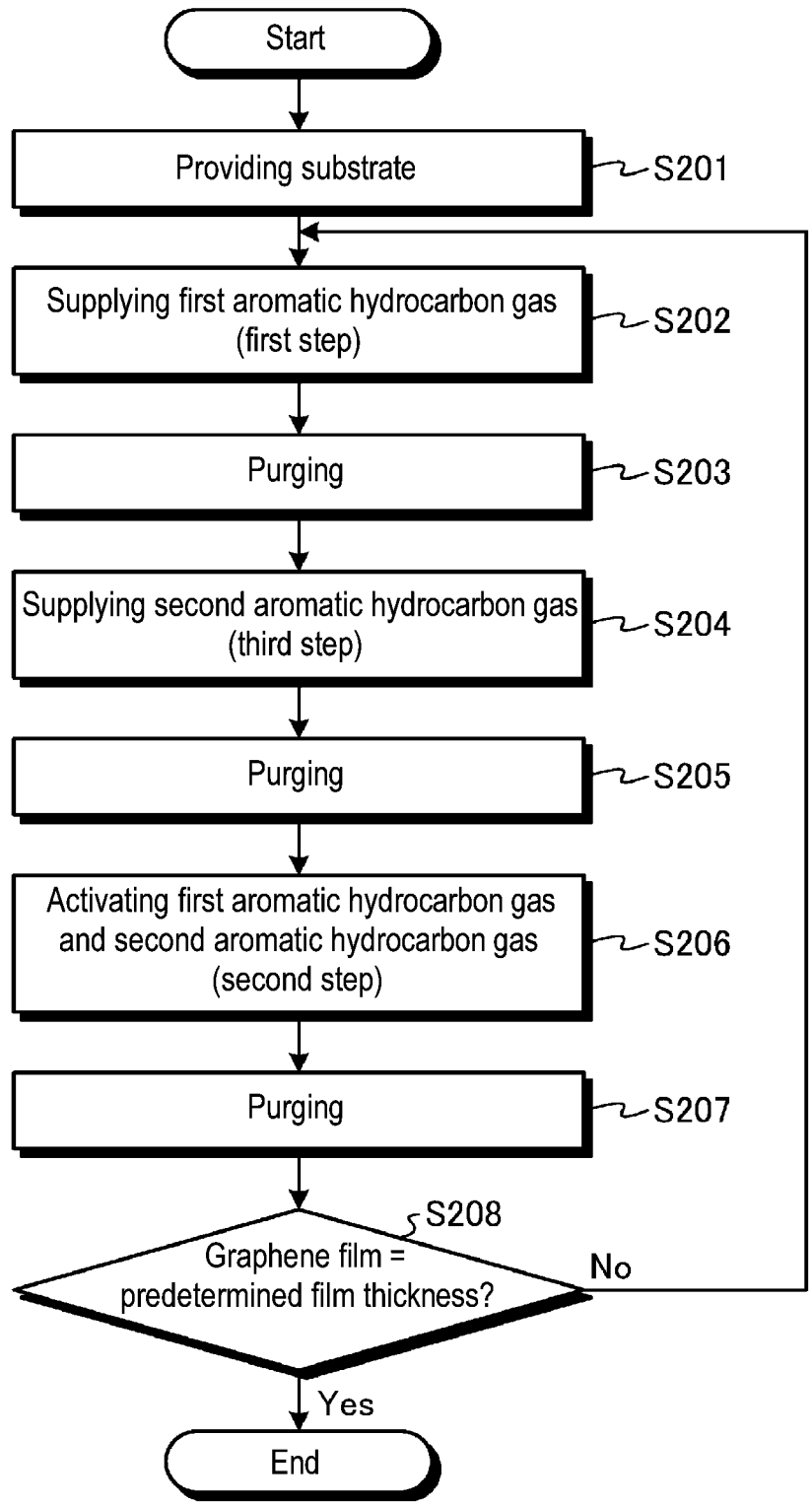
FIG. 4 is a flowchart illustrating an example of the flow of a film forming method according to Modification 1.

Hereinafter, various embodiments will be described in detail with reference to the drawings. The technology disclosed herein is not limited by the following embodiments.

In a plasma CVD method, for example, when forming a graphene film as a carbon film on a substrate having an underlayer film thereon, the temperature of the substrate may be lowered in order to suppress a change in the film quality of the underlayer film. However, in the plasma CVD method, the lower the temperature of the substrate, the slower the growth of the carbon film on the underlayer film and the lower the film quality. Therefore, it is expected to improve the efficiency of forming a carbon film in a low-temperature environment.

(Example of Flow of Film Forming Method of Embodiment)

FIG. 1 is a flowchart illustrating an example of the flow of a film forming method according to an embodiment. In the film forming method according to the embodiment, a carbon film is formed on a substrate by using a microwave plasma atomic layer deposition (ALD) method. With reference to FIG. 1, the case where a graphene film is formed as a carbon film on a substrate provided with an underlayer film will be described as an example. First, a substrate provided with an underlayer film is provided (step S101). For example, a semiconductor substrate provided with an underlayer film is placed in a processing container. The underlayer film is, for example, an insulating film such as a silicon dioxide ($SiO_2$) film.

Next, a first aromatic hydrocarbon gas having a first functional group is supplied to the substrate (step S102, first step). The first functional group is, for example, a functional group having an electron imbalance (e.g., unshared electron pairs). The first aromatic hydrocarbon gas is, for example, at least one aromatic hydrocarbon gas selected from toluene ($C_6H_5CH_3$), aniline ($C_6H_5NH_2$) and dichlorobenzene ($C_6H_4Cl_2$).

Next, the processing container is purged to discharge the components of the first aromatic hydrocarbon gas excessively adsorbed on the surface of the underlayer film (step S103).

Next, the first aromatic hydrocarbon gas adsorbed on the surface of the underlayer film is activated by the plasma of a first reaction gas containing at least a rare gas to form a graphene film on the surface of the underlayer film (step S104, second step). The rare gas is, for example, argon (Ar). The first reaction gas may be a mixed gas containing the rare gas and a carbon-containing gas. The carbon-containing gas is, for example, acetylene (C2H2). A hydrogen-containing gas may be added to the first reaction gas. The hydrogen-containing gas is, for example, hydrogen (H2) or the like. The plasma of the first reaction gas is generated by using, for example, microwaves, capacitive coupling, or the like.

Next, the processing container is purged to discharge the components of the first reaction gas excessively adsorbed on the surface of the underlayer film (step S105). Next, it is determined whether or not the graphene film formed on the surface of the underlayer film in steps S101 to S105 has reached a predetermined film thickness (step S106). When it is determined that the graphene film has not reached the predetermined film thickness (step S106, "No"), the process returns to step S102 and repeats up to step S105. On the other hand, when it is determined that the graphene film has reached the predetermined film thickness (step S106, "Yes"), the process is terminated.

During the process illustrated in FIG. 1, the temperature of the substrate in the first step and the second step is maintained, for example, within the range of 25 degrees C. to 550 degrees C. The purging in steps S103 and S105 may be omitted.

The determination in step S106 is made based on, for example, whether or not steps S102 to S105 have been performed a predetermined number of times.

FIGS. 2A to 2C are views for describing an example of a graphene film formed by the film forming method according to the embodiment. The film forming method according to the embodiment will be further described with reference to FIGS. 2A to 2C.

The substrate W illustrated in FIGS. 2A to 2C includes an underlayer film 302 formed on a semiconductor substrate 301. First, the substrate W is placed in the processing container. Next, a first aromatic hydrocarbon gas having a first functional group is supplied to the substrate W in step S102. The first aromatic hydrocarbon gas is adsorbed on the surface of the underlayer film 302 as a precursor gas to form the layer illustrated in FIG. 2A. After purging the processing container, plasma of the first reaction gas containing at least a rare gas is generated in the processing container in step S104. The temperature of the substrate W in steps S102 and S104 is maintained, for example, within a range of 25 degrees C. to 550 degrees C. The plasma of the first reaction gas activates the first aromatic hydrocarbon gas on the surface of the underlayer film 302 to form a graphene film 303 (FIG. 2B). After purging the processing container, steps S102 to S105 are repeated to form a graphene film 303 having a desired thickness (FIG. 2C). Since the first aromatic hydrocarbon gas activated by plasma has the first functional group, the growth of the graphene film 303 is promoted on the surface of the underlayer film 302.

(Mechanism for Promoting Growth of Graphene Film)

FIG. 3 is a view for describing an example of a mechanism for promoting growth of a graphene film by the film forming method according to an embodiment. A mechanism by which the growth of the graphene film 303 is promoted when the first aromatic hydrocarbon gas having the first functional group is used will be described with reference to FIG. 3. The left side of FIG. 3 illustrates the state of toluene ($C_6H_5CH_3$), which is the first aromatic hydrocarbon gas adsorbed on the surface of the underlayer film 302. When toluene is activated by the plasma of the first reaction gas in the second step (step S104), a methyl group ($CH_3$—), which is the first functional group, is detached from an activated toluene. The left side of FIG. 3 illustrates positions at which methyl groups are detached as detachment positions D. At the detachment positions D, the connection of adjacent 6-membered rings of carbon atoms contained in toluene is initiated. That is, C—C bonds are formed starting from the detachment positions D of methyl groups. Then, the six-membered rings of carbon atoms contained in adjacent toluenes are sequentially connected to each other by C—C bonds, so that a graphene film 303 having the six-membered rings of carbon atoms grows on the surface of the underlayer film 302, as illustrated in the right side of FIG. 3. A detached methyl group is bonded to a H atom of a C—H bond of a toluene molecule to form a methane molecule, forming a new detachment position in the toluene molecule.

In this way, when the first aromatic hydrocarbon gas activated by plasma has the first functional group, the growth of the graphene film 303 is promoted. As a result, even in a low-temperature environment in which the temperature of the substrate W is maintained within the range of 25 degrees C. to 550 degrees C., it is possible to efficiently form the graphene film 303.

In the second step, when a carbon-containing gas is added to the first reaction gas, since the carbon-containing gas contributes as a bond component that connects six-membered rings of carbon atoms when the graphene film 303 grows, formation of the graphene film 303 can be promoted. Therefore, a mixed gas containing a rare gas and a carbon-containing gas may be used as the first reaction gas. In the second step, when the hydrogen-containing gas is added to the first reaction gas, the hydrogen-containing gas contributes to the graphene film 303 as an etching component when the graphene film 303 grows. That is, the hydrogen-containing gas is capable of adjusting the growth rate of the graphene film 303 by etching unstable C—C bonds. Therefore, the first reaction gas may further include a hydrogen-containing gas.

(Modification 1—Activation of Two Types of Precursors)

In the above-described embodiment, the case where a single precursor (that is, the first aromatic hydrocarbon gas) is activated to form a graphene film has been described. The embodiment can be further modified. FIG. 4 is a flowchart illustrating an example of the flow of a film forming method according to Modification 1. Modification 1 forms a graphene film by activating two types of precursors.

In the film forming method according to Modification 1, the processes from providing a substrate W (step S201) to purging (step S203) are the same as steps S101 to S103 of the above-described embodiment, respectively. In Modification 1, after step S203, a second aromatic hydrocarbon gas having a second functional group is supplied to the substrate (step S204, third step). The second functional group is, for example, a functional group having an electron imbalance (e.g., unshared electron pairs). The second aromatic hydrocarbon gas is, for example, at least one aromatic hydrocarbon gas selected from toluene ($C_6H_5CH_3$), aniline ($C_6H_5NH_2$), and dichlorobenzene ($C_6H_4Cl_2$), and is an aromatic hydrocarbon gas different from the first aromatic hydrocarbon gas. The second aromatic hydrocarbon gas may be the same aromatic hydrocarbon gas as the first aromatic hydrocarbon.

Next, the processing container is purged to discharge the components of the second aromatic hydrocarbon gas excessively adsorbed on the surface of the underlayer film (step S205).

Next, the first aromatic hydrocarbon gas and the second aromatic hydrocarbon gas adsorbed on the surface of the underlayer film is activated by the plasma of a first reaction gas containing at least a rare gas to form a graphene film on the surface of the underlayer film (step S206, second step). The rare gas is, for example, argon (Ar). A hydrogen-containing gas may be added to the first reaction gas. The hydrogen-containing gas is, for example, hydrogen (H2) or the like. The plasma of the first reaction gas is generated by using, for example, microwaves, capacitive coupling, or the like. In the second step, C—C bonds are formed starting from the positions where the first and second functional groups are detached from the activated first and second aromatic hydrocarbon gases. The subsequent processes from purging (step S207) to step S208 are the same as steps S105 to S106 in the above-described embodiment, respectively.

Thus, by activating the first and second aromatic hydrocarbon gases, which are two types of precursors, to form a graphene film, it is possible to increase positions from which C—C bonds are formed. As a result, it is possible to more efficiently form a graphene film.

(Modification 2-Stepwise Activation)

Figure 5:
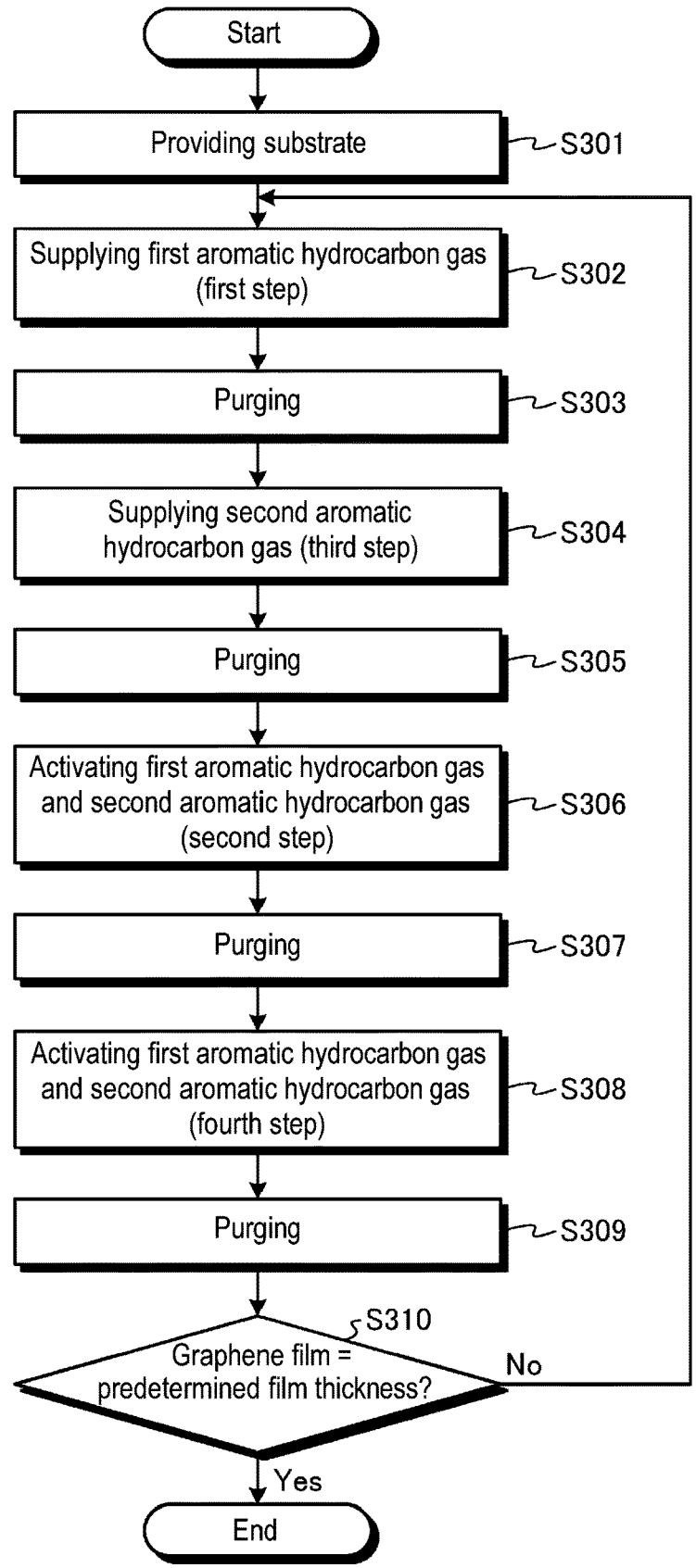
FIG. 5 is a flowchart illustrating an example of the flow of a film forming method according to Modification 2.

FIG. 5 is a flowchart illustrating an example of the flow of a film forming method according to Modification 2. In Modification 2, a graphene film is formed through stepwise activation of two types of precursors.

In the film forming method according to Modification 2, the processes from providing a substrate W (step S301) to purging (step S307) are the same as steps S201 to S207 of the above-described Modification 1, respectively. In Modification 2, after activating the adsorbed gas (step S307), the first and second aromatic hydrocarbon gases adsorbed on the surface of the underlayer film are further activated by plasma of a second reaction gas containing at least a rare gas (step S308, fourth step). The rare gas is, for example, argon (Ar). The second reaction gas may be a mixed gas containing the rare gas and a carbon-containing gas. The carbon-containing gas is, for example, acetylene (C2H2) or the like. A hydrogen-containing gas may also be added to the second reaction gas. The hydrogen-containing gas is, for example, hydrogen (H2) or the like. The second reaction gas is a gas different from the first reaction gas. The second reaction gas may be the same gas as the first reaction gas. The plasma of the second reaction gas is generated by using, for example, microwaves.

Next, the processing container is purged to discharge the components of the second reaction gas excessively adsorbed on the surface of the underlayer film (step S309). Subsequent step S310 is the same as step S208 of the above-described Modification 1.

In this way, by forming a graphene film through stepwise activation of the first and second aromatic hydrocarbon gases, which are two types of precursors, by the plasma of the first and second reaction gases, it is possible to reinforce unstable C—C bonds of the graphene film. As a result, it is possible to stabilize the structure of the graphene film.

(Modification 3—Formation of Adsorption Sites)

Figure 6:
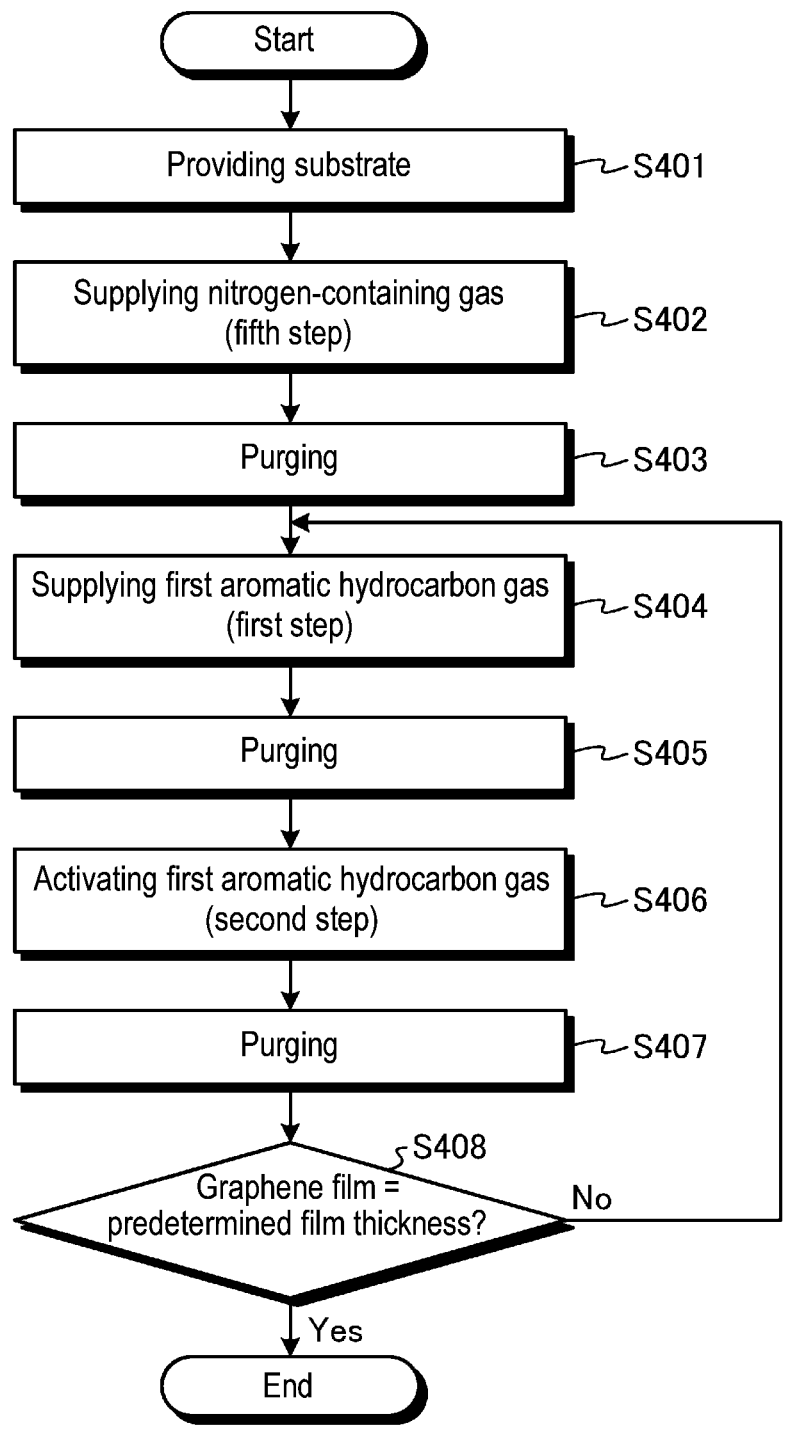
FIG. 6 is a flowchart illustrating an example of the flow of a film forming method according to Modification 3.

FIG. 6 is a flowchart illustrating an example of the flow of a film forming method according to Modification 3. In Modification 3, adsorption sites capable of adsorbing a precursor are formed on the surface of an underlayer film before supplying the precursor (first step).

In the film forming method according to Modification 3, after providing a substrate W (Step S401), a molecular gas having polarity, for example, a nitrogen-containing gas, is supplied to the substrate W to form adsorption sites capable of adsorbing a first aromatic hydrocarbon gas which is a precursor, on the surface of the underlayer film (step S402, fifth step). Next, the processing container is purged to discharge the components of a nitrogen-containing gas excessively adsorbed on the surface of the underlayer film (step S403). The subsequent processes from supplying the first aromatic hydrocarbon gas (step S404) to step S408 are the same as steps S102 to S106 in the above-described embodiment, respectively.

In this way, by forming the adsorption sites on the surface of the underlayer film before supplying the precursor, it is possible to increase the amount of the precursor adsorbed on the surface of the underlayer film. As a result, it is possible to stably form a graphene film through the activation of the precursor adsorbed on the surface of the underlayer film.

In Modification 3, an example in which supplying of the nitrogen-containing gas (step S402, fifth step) is performed before supplying of the precursor (first step) has been illustrated, but the fifth step may be performed each time the repetition of the first and second steps is completed.

(Experimental Results—Presence/Absence of Growth of Graphene Film)

Next, an experiment was conducted to determine the presence or absence of growth of a graphene film when the film forming method according to Modification 1 (see FIG. 4), in which the plasma in the second step was microwave plasma or capacitively coupled plasma, was applied to each of three substrates W provided with different underlayer films. In the experiment, three substrates W, each of which has a $SiO_2$ film, a Cu film, or a Co film as an underlayer film, were used. In the experiment, each of the first to third steps of the film forming method according to Modification 1 was performed under the following processing conditions.

Formation of Graphene Film by Microwave Plasma:

<First Step>

Pressure inside processing container: 1 Torr (133 Pa)
  Processing gas: 1,3-dichlorobenzene=10 sccm
  Temperature of substrate W: 350 degrees C.
  Processing time: 5 sec <Third Step>

Pressure inside processing container: 1 Torr (133 Pa)
  Processing gas: aniline=10 sccm
  Temperature of substrate W: 350 degrees C.
  Processing time: 5 sec <Second Step>

Figure 7:
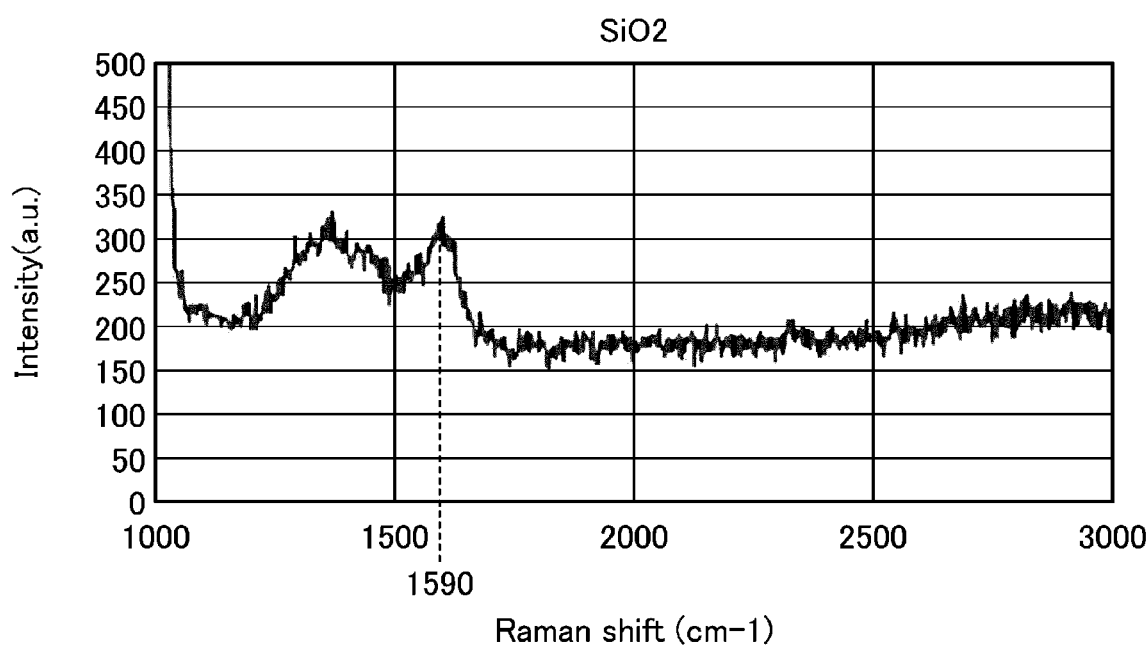
FIG. 7 is a diagram showing an example of Raman spectrum distribution on the surface of a $SiO_2$ film when the film forming method of Modification 1 was applied to a substrate having the $SiO_2$ film.
Figure 8:
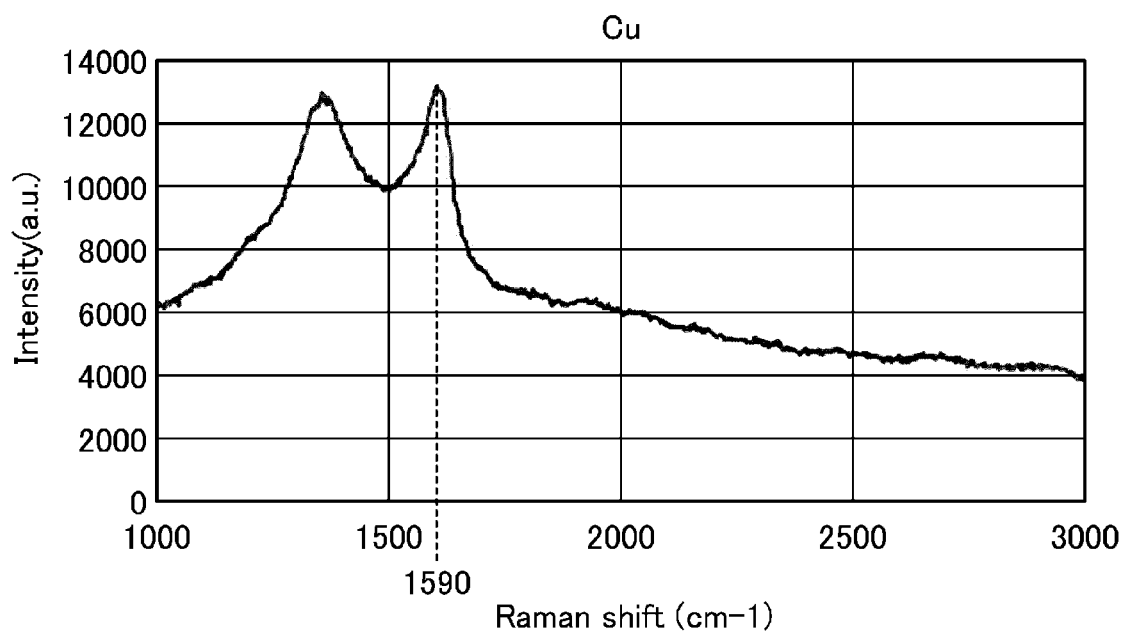
FIG. 8 is a diagram showing an example of Raman spectrum distribution on the surface of a Cu film when the film forming method of Modification 1 was applied to a substrate having the Cu film.
Figure 9:
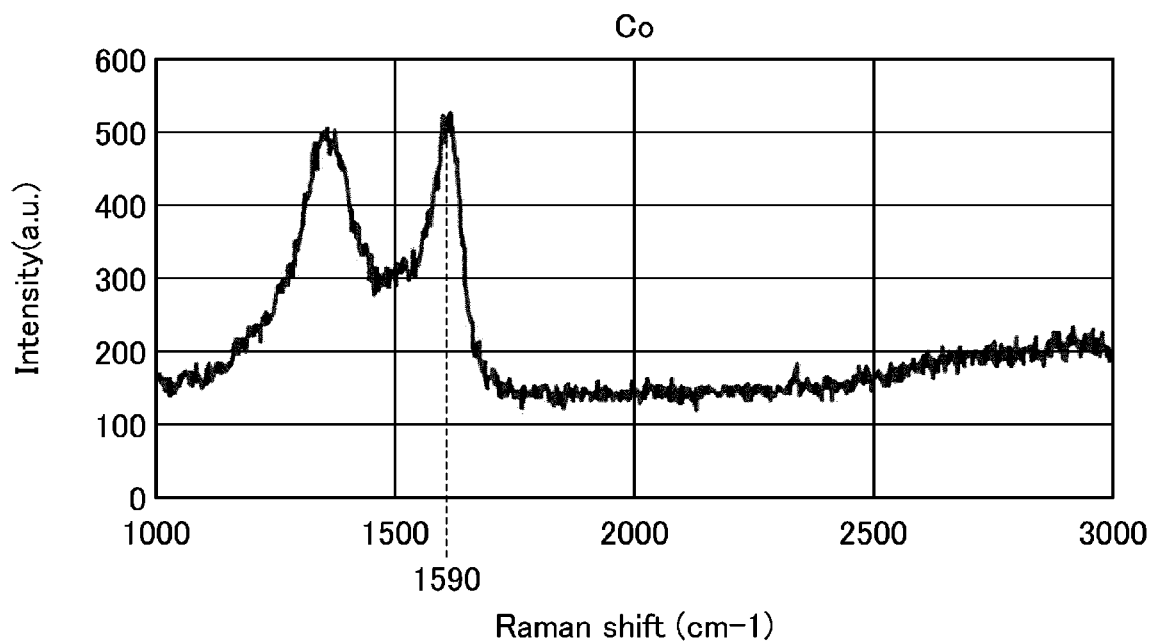
FIG. 9 is a diagram showing an example of Raman spectrum distribution on the surface of a Co film when the film forming method of Modification 1 was applied to a substrate having the Co film.
Figure 10:
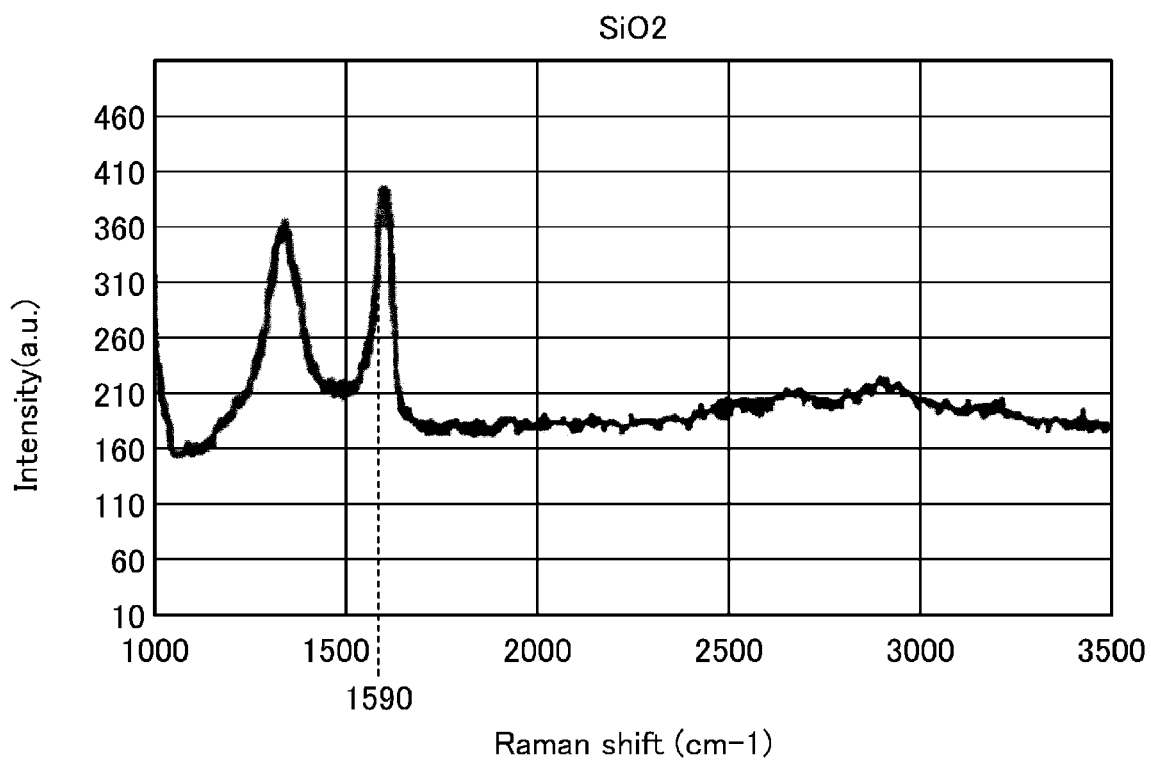
FIG. 10 is a diagram showing an example of Raman spectrum distribution on the surface of a $SiO_2$ film when the film forming method of Modification 1 was applied to a substrate having the $SiO_2$ film.
Figure 11:
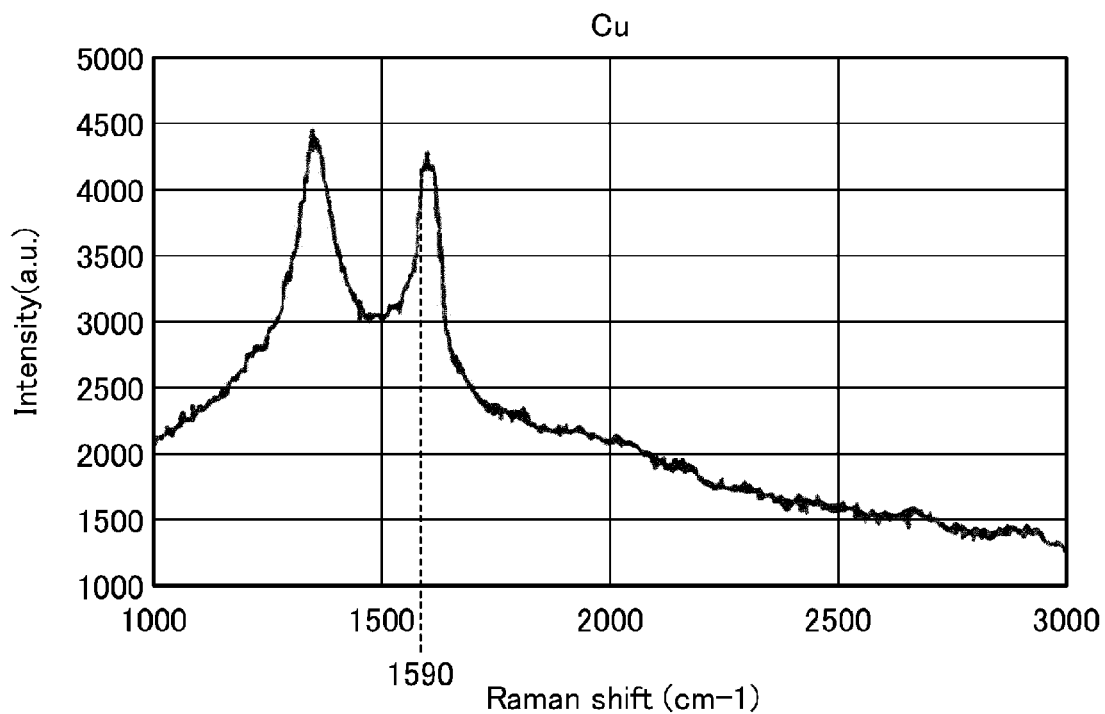
FIG. 11 is a diagram showing an example of Raman spectrum distribution on the surface of a Cu film when the film forming method of Modification 1 was applied to a substrate having the Cu film.
Figure 12:
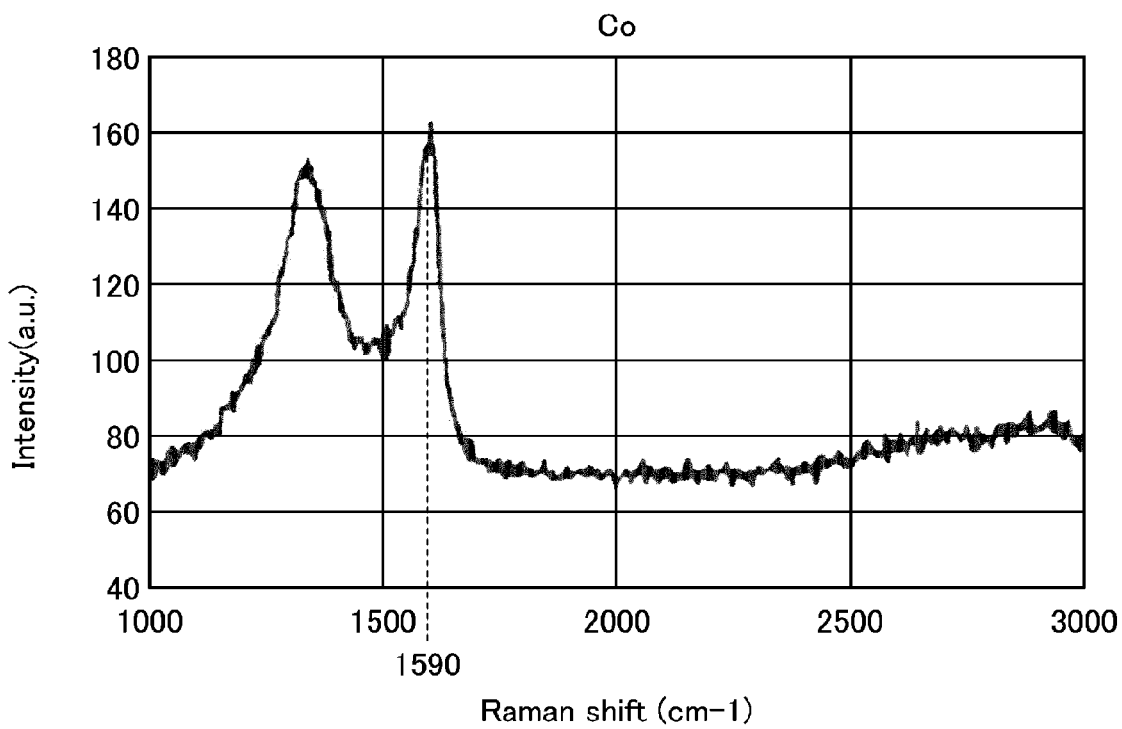
FIG. 12 is a diagram showing an example of Raman spectrum distribution on the surface of a Co film when the film forming method of Modification 1 was applied to a substrate having the Co film.

Microwave power: 400 W
  Pressure inside processing container: 1 Torr (133 Pa)
  Processing gas: Ar=500 sccm
  Temperature of substrate W: 350 degrees C.
  Processing time: 5 sec Formation of graphene film by capacitively coupled plasma <First Step>
Pressure inside processing container: 3 Torr (400 Pa)
Processing gas: toluene=10 sccm
Temperature of substrate W: 350 degrees C.
Processing time: 5 sec <Second Step>
Plasma power: 50 W (13.56 MHz)
Pressure inside processing container: 3 Torr (400 Pa)
Processing gas: Ar=500 sccm
Temperature of substrate W: 350 degrees C.
Processing time: 5 sec FIGS. 7 and 10 are diagrams each showing an example of Raman spectrum distribution on the surface of a $SiO_2$ film when the film forming method of Modification 1 was applied to a substrate W having the $SiO_2$ film. FIGS. 8 and 11 are diagrams each showing an example of Raman spectrum distribution on the surface of a Cu film when the film forming method of Modification 1 was applied to a substrate W having the Cu film. FIGS. 9 and 12 are diagrams each showing an example of Raman spectrum distribution on the surface of a Co film when the film forming method of Modification 1 was applied to a substrate W having the Co film. In Raman spectrum distribution, it is known that when a graphene film is present, a peak called a G band appears due to in-plane vibration of six-membered ring structures of carbon atoms contained in the graphene film. The G band appears at a position near 1590 $cm^{-1}$ in the Raman spectrum. The appearance of the G band indicates the presence of a graphene film.

As shown in FIGS. 7 to 12, the appearance of the G band was confirmed when any of three substrates W having the $SiO_2$ film, the Cu film, or the Co film as an underlayer film was used. That is, the experimental results of FIGS. 7 to 12 show that, with the film forming method according to Modification 1, it is possible to grow a graphene film regardless of the type of the underlayer film.

Figure 13:
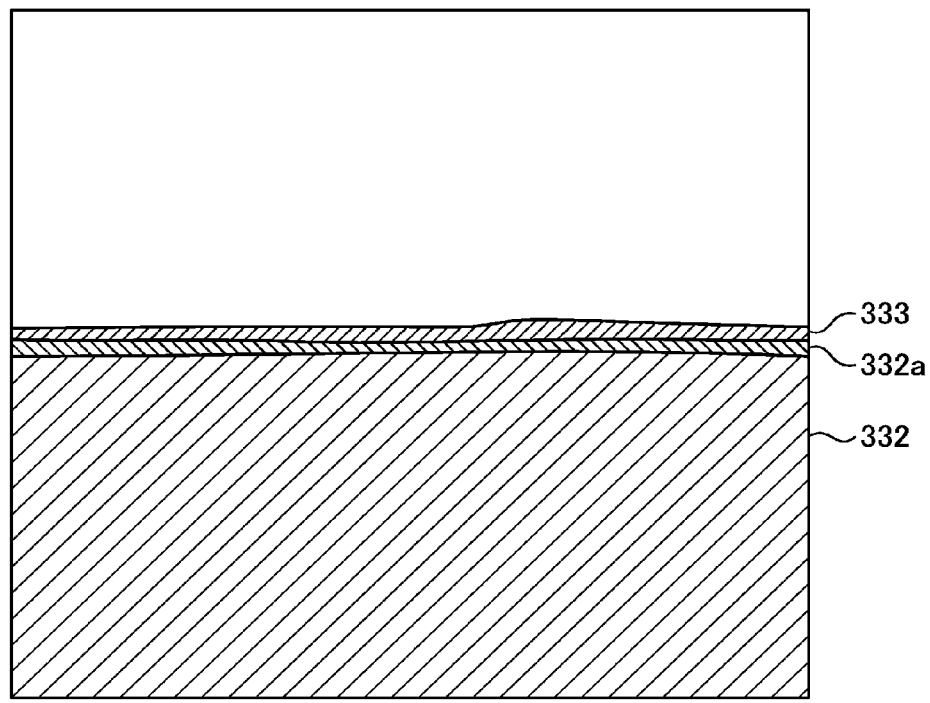
FIG. 13 is a transmission electron microscope (TEM) photograph showing an example of a cross section of a substrate W having an $SiO_2$ film when the film forming method of Modification 1 was applied to the substrate.

FIG. 13 is a TEM photograph showing an example of a cross section of a substrate W having a $SiO_2$ film when the film forming method of Modification 1 using microwave plasma as the plasma in the second step was applied to the substrate W. The substrate W illustrated in FIG. 13 includes a silicon (Si) substrate 332 and a $SiO_2$ film 332a as an underlayer film. The $SiO_2$ film 332a is, for example, a natural oxide film. It was confirmed that a graphene film 333 was formed on the surface of the $SiO_2$ film 332a when the film forming method of Modification 1, in which the plasma in the second step was microwave plasma, was applied to the substrate W. When forming a graphene film on an underlayer film having a fine pattern or a pattern with a high aspect ratio, there is a problem where with a CVD method, since the raw material (precursor) is consumed at a top portion of the pattern and in the vicinity of an opening in the pattern, it is possible to form a film at the top portion of the pattern and in the vicinity of the opening in the pattern, but it is impossible to form a film on a side wall and a bottom portion of the pattern corresponding to the inner side of the pattern. In order to solve this problem, when an ALD method in which a raw material is saturated and adsorbed on the surface of the patterned underlayer to form a film is used, it is possible to form a graphene film on the entire surface of the patterned underlayer film.

(Application to Substrate W Provided with Patterned Underlayer Film)

Figure 14:
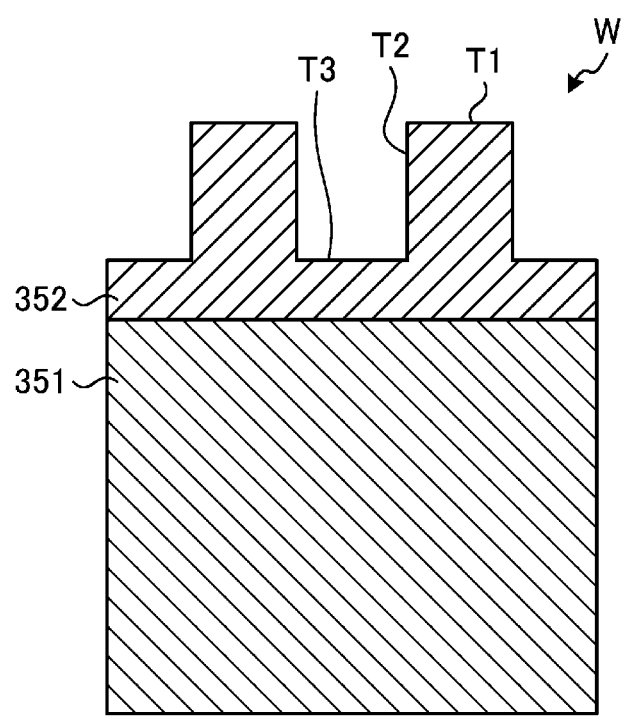
FIG. 14 is a view illustrating an example of a cross section of a substrate to which the film forming method of Modification 1 is applied.

Next, an example in which the film forming method of Modification 1 using microwave plasma as the plasma in the second step is applied to a substrate W provided with a patterned underlayer film will be described. FIG. 14 is a view illustrating an example of a cross section of the substrate W to which the film forming method of Modification 1 using microwave plasma as the plasma in the second step is applied. The substrate W illustrated in FIG. 14 includes an underlayer film 352 formed on a semiconductor substrate 351. A pattern having a top portion T1, a sidewall T2, and a bottom portion T3 is formed on the underlayer film 352. A conformal graphene film is formed on the patterned surface of the underlayer film 352 by applying the film forming method of Modification 1 using microwave plasma as the plasma in the second step to the substrate W illustrated in FIG. 14. Here, each of the first to third steps of the film forming method according to Modification 1 using microwave plasma as the plasma in the second step was performed under the same processing conditions as in the above-described experiment.

Figure 15A:
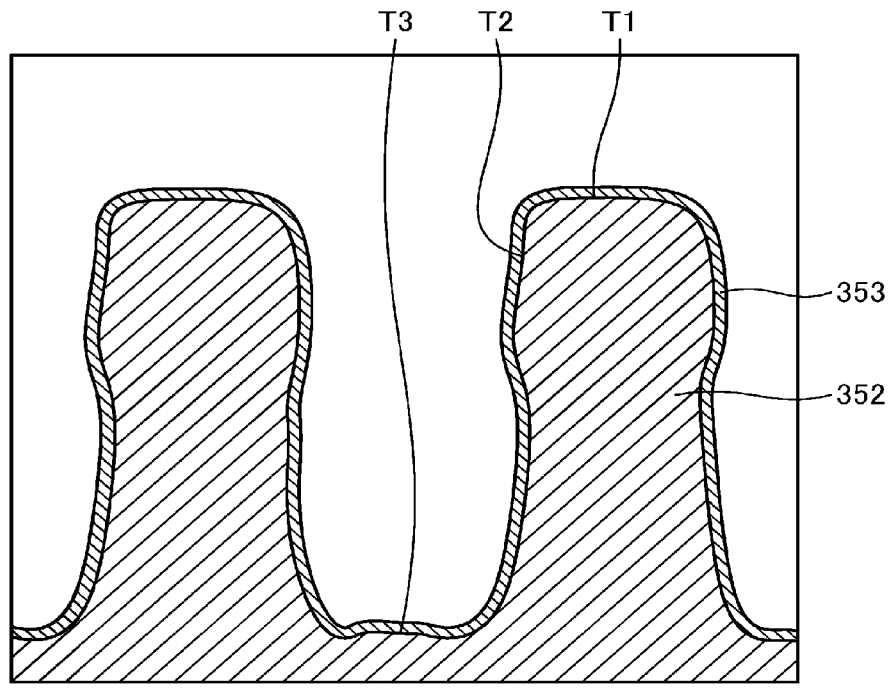
FIG. 15A is a TEM photograph showing an example of a cross section of a substrate provided with a patterned underlayer film when the film forming method of Modification 1 was applied to the substrate.

FIG. 15A is a TEM photograph showing an example of a cross section of a substrate W provided with a patterned underlayer film 352 when the film forming method of Modification 1 using microwave plasma as the plasma in the second step was applied to the substrate W. When the film forming method of Modification 1 using microwave plasma as the plasma in the second step was applied to the substrate W, it was confirmed that a graphene film 353 was formed on the surfaces of the top portion T1, the side wall T2, and the bottom portion T3 of the pattern. That is, the TEM photograph of FIG. 15A shows that with the film forming method of Modification 1, it is possible to improve the step coverage for the pattern of the underlayer film 352.

In contrast, an example in which a film forming method of a comparative example is applied to a substrate W having a patterned underlayer film will be described. In the film formation method of the comparative example, a graphene film, which is a carbon film, is formed on the substrate using a microwave plasma CVD method. The substrate to which the film forming method of the comparative example is applied has the same structure as the substrate W illustrated in FIG. 14. Here, the film forming method of the comparative example includes a pre-processing step and a film forming step, and each step was performed under the following processing conditions.

Figure 15B:
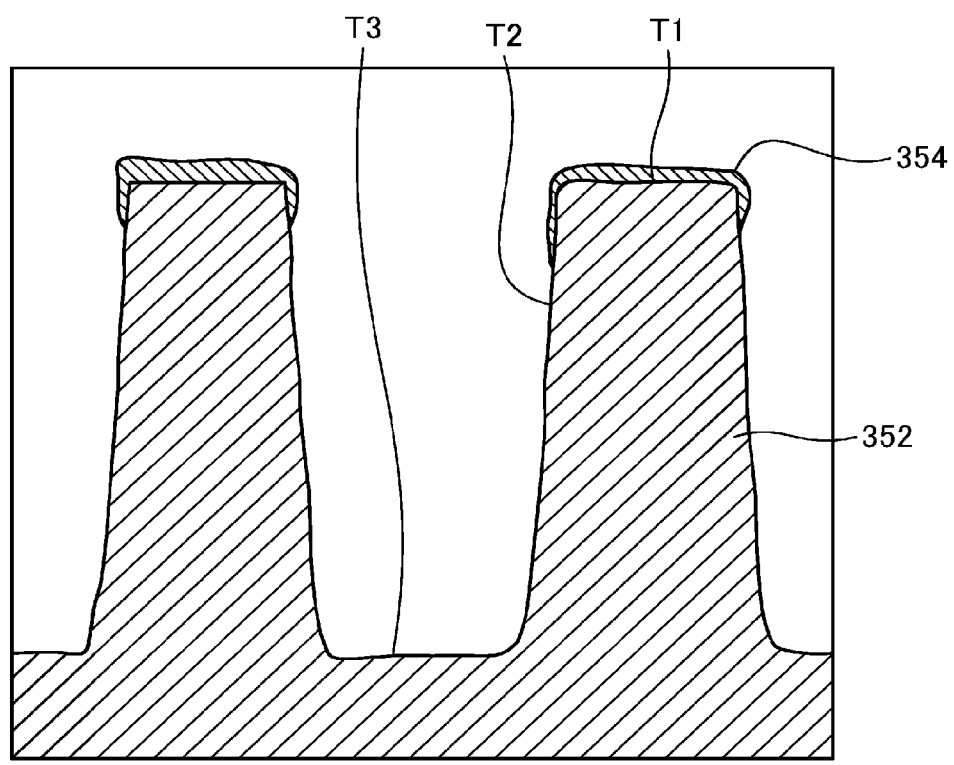
FIG. 15B is a TEM photograph showing an example of a cross section of a substrate provided with a patterned underlayer film when a film forming method of a comparative example was applied to the substrate.

<Pre-Processing Step>
Microwave power: 2,000 W
Pressure inside processing container: 3 Torr (399 Pa)
Processing gas: $H_2$/Ar=50/1000 sccm
Temperature of substrate W: 400 degrees C.
Processing time: 600 sec <Film Forming Step>
Microwave power: 2,000 W
Pressure inside the processing container: 0.01 Torr (1.33 Pa)
Processing gas: $C_2H_4$/Ar=20/500 sccm
Temperature of substrate W: 400 degrees C.
Processing time: 180 sec FIG. 15B is a TEM photograph illustrating an example of a cross section of the substrate W provided with the patterned underlayer film 352 when the film forming method of the comparative example was applied to the substrate W. When the film forming method of the comparative example is applied to the substrate W, it was confirmed that a graphene film 354 is formed only on the top portion T1 of the pattern and the vicinity of the opening surrounded by the top portion T1, and no graphene film is formed on the side wall T2 and the bottom portion T3. That is, the TEM photograph of FIG. 15B shows that the step coverage for the pattern of the underlayer film 352 deteriorates in the film forming method of the comparative example using the microwave plasma CVD method.

Next, an example in which a film forming method of an embodiment using capacitively coupled plasma as the plasma in the second step is applied to a substrate W having a patterned underlayer film 352 will be described. Specifically, an experiment in which a film forming method according to an embodiment using capacitively coupled plasma, as the plasma in the second step, was applied to a substrate W provided with the pattern illustrated in FIG. 14 was conducted.

Figure 16:
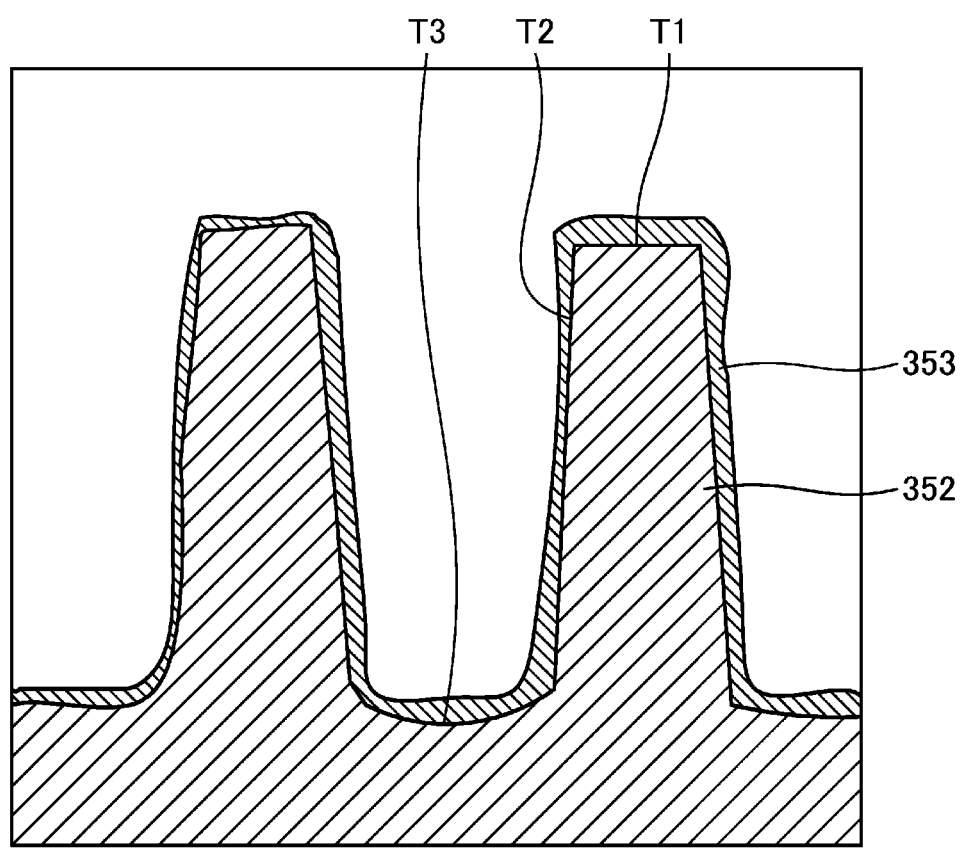
FIG. 16 is a scanning electron microscope (SEM) photograph showing an example of a cross section of a substrate provided with a patterned underlayer film when the film forming method of Modification 1 was applied to the substrate.

FIG. 16 is an SEM photograph showing an example of a cross section of a substrate W provided with a patterned underlayer film 352 when the film forming method of the embodiment using capacitively coupled plasma as the plasma in the second step was applied to the substrate W. It was confirmed that when the film forming method of the embodiment using the capacitively coupled plasma as the plasma in the second step is applied to the substrate W, a graphene film 354 is formed on the surfaces of the top portion T1, the side wall T2, and the bottom portion T3 of the pattern. That is, the SEM photograph of FIG. 16 shows that it is possible to improve the step coverage for the pattern of the underlayer film 352 by the film forming method of the embodiment.

Example of Film Forming Apparatus According to One Embodiment

Figure 17:
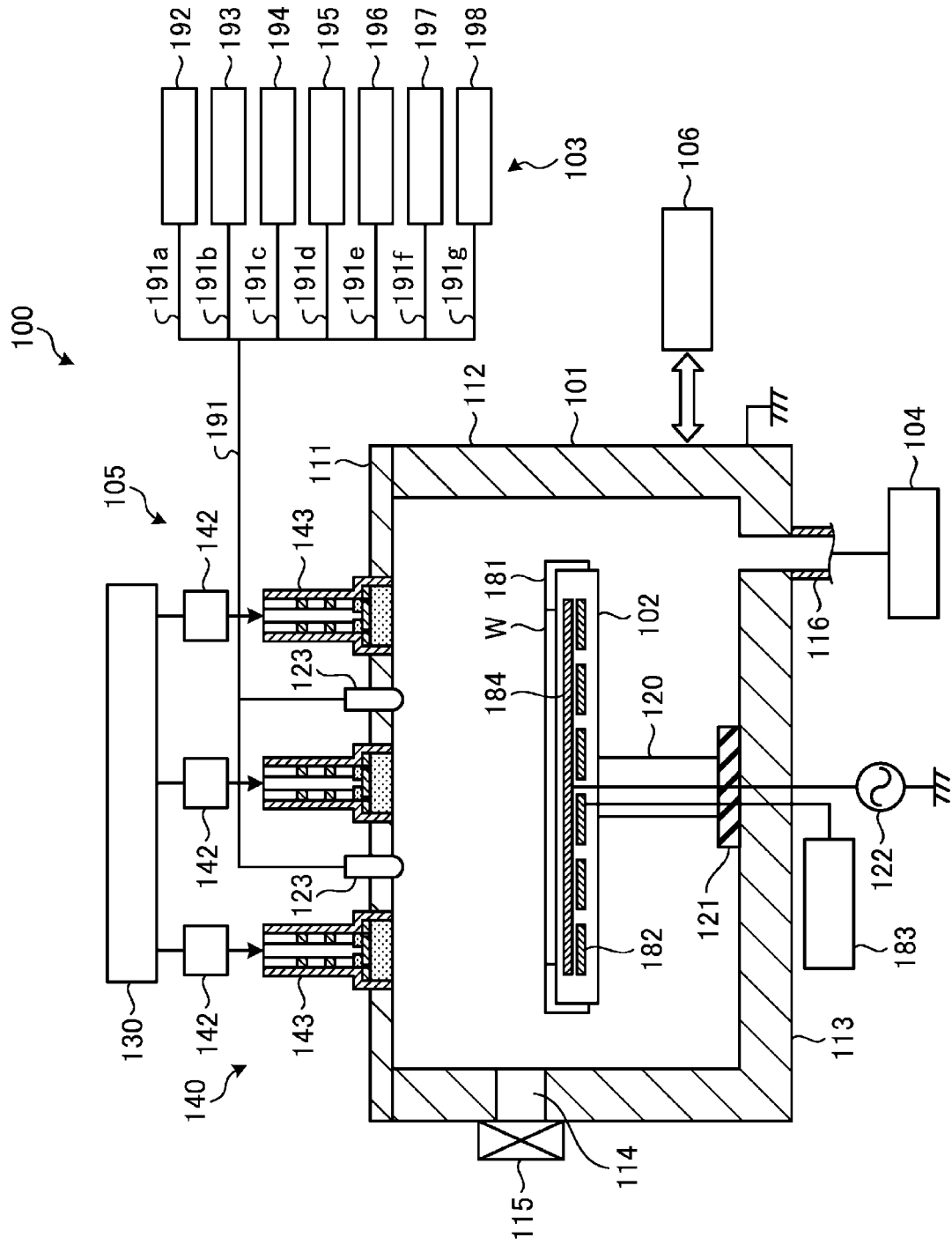
FIG. 17 is a view illustrating an example of a film forming apparatus for performing a film forming method according to an embodiment.

FIG. 17 is a view illustrating an example of a film forming apparatus for performing a film forming method according to an embodiment. The processing apparatus 100 illustrated in FIG. 17 includes a processing container 101, a stage 102, a gas supply mechanism 103, an exhaust device 104, a microwave introduction device 105, and a controller 106. The processing container 101 accommodates a substrate W. A substrate W is placed on the stage 102. The gas supply mechanism 103 supplies gas into the processing container 101. The interior of the processing container 101 is exhausted by the exhaust device 104. The microwave introduction device 105 generates microwaves for generating plasma in the processing container 101 and introduces the microwaves into the processing container 101. The controller 106 controls the operation of each part of the processing apparatus 100.

The processing container 101 is formed of a metal material, such as aluminum or an alloy thereof, in a substantially cylindrical shape, and has a plate-shaped ceiling wall 111, a bottom wall 113, and a side wall 112 connecting the ceiling wall 111 and the bottom wall 113. The microwave introduction device 105 is provided in an upper portion of the processing container 101, and functions as plasma generator that introduces electromagnetic waves (microwaves) into the processing container 101 to generate plasma. The microwave introduction device 105 will be described in detail later.

The ceiling wall 111 has a plurality of openings into which a microwave radiation mechanism and a gas introduction part of the microwave introduction device 105 to be described later are fitted. The side wall 112 has a carry-in/out port 114 for performing carry-in/out of a substrate W, which is a substrate to be processed, with respect to a transport chamber (not illustrated) adjacent to the processing container 101. The carry-in/out port 114 is configured to be opened and closed by a gate valve 115. The bottom wall 113 is provided with an exhaust device 104. The exhaust device 104 is provided in an exhaust pipe 116 connected to the bottom wall 113 and includes a vacuum pump and a pressure control valve. By the vacuum pump of the exhaust device 104, the interior of the processing container 101 is exhausted through the exhaust pipe 116. The pressure inside the processing container 101 is controlled by the pressure control valve.

The stage 102 has a disc shape and is made of ceramic, such as AlN. The stage 102 is supported by a cylindrical support member 120 made of ceramic, such as AlN, and extending upward from the center of the bottom of the processing container 101. A guide ring 181 configured to guide the substrate W is provided on the outer edge of the stage 102. Inside the stage 102, lifting pins (not illustrated) configured to raise and lower a substrate W are provided to be capable of protruding and retracting with respect to the top surface of the stage 102. A resistance heating type heater 182 is embedded inside the stage 102, and the heater 182 heats the substrate W on the stage 102 via the stage 102 by being supplied with power from a heater power supply 183. A thermocouple (not illustrated) is inserted into the stage 102, so that it is possible to control the heating temperature of the substrate W to a predetermined temperature, for example, in the range of 25 to 1,000 degrees C., based on a signal from the thermocouple. In addition, an electrode 184 having a size similar to that of the substrate W is embedded above the heater 182 in the stage 102, and a radio-frequency bias power supply 122 is electrically connected to the electrode 184. A radio-frequency bias for attracting ions is applied from the radio-frequency bias power supply 122 to the stage 102. The radio-frequency bias power supply 122 may not be provided depending on a plasma processing characteristic.

The gas supply mechanism 103 is configured to introduce a plasma-generating reaction gas and a precursor gas for forming a carbon film (a graphene film) into the processing container 101, and includes a plurality of gas introduction nozzles 123. Gas introduction nozzles 123 are fitted into respective openings formed in the ceiling wall 111 of the processing container 101. A gas supply pipe 191 is connected to the gas introduction nozzles 123. The gas supply pipe 191 branches into five branch pipes 191a, 191b, 191c, 191d, and 191e. Gas sources 192, 193, 194, 195, 196, and 197 are connected to these branch pipes 191a, 191b, 191c, 191d, and 191e, respectively. The gas source 192 supplies toluene ($C_6H_5CH_3$) as an aromatic hydrocarbon gas, which is a precursor gas for a graphene film. The gas source 193 supplies aniline ($C_6H_5NH_2$) as an aromatic hydrocarbon gas, which is a precursor gas for a graphene film. The gas source 194 supplies dichlorobenzene ($C_6H_4Cl_2$) as an aromatic hydrocarbon gas, which is a precursor gas for a graphene film. The gas source 195 supplies argon (Ar) as a rare gas, which is a reaction gas for plasma generation. The gas source 196 supplies hydrogen ($H_2$) as a reducing gas. The gas source 197 supplies nitrogen ($N_2$) or ammonia ($NH_3$) as a nitrogen-containing gas used as a purge gas or a gas for forming adsorption sites. The gas source 198 supplies acetylene ($C_2H_2$) as a carbon-containing gas that contributes as a bond component. The aromatic hydrocarbon gases supplied by the gas sources 193 to 195 are examples of the first aromatic hydrocarbon gas and the second aromatic hydrocarbon gas. In addition, the rare gas supplied by the gas source 195 is an example of the first reaction gas and the second reaction gas.

Although not illustrated, each of the branch pipes 191a, 191b, 191c, 191d, and 191e is provided with a mass flow controller for controlling a flow rate and valves before and after the mass flow controller. It is also possible to adjust the dissociation of gas by providing a shower plate and supplying $C_2H_2$ gas and $H_2$ gas to a position close to the substrate W. The same effect can also be obtained by extending nozzles configured to supply these gases downward.

As described above, the microwave introduction device 105 is provided in the upper portion of the processing container 101, and functions as a plasma generator that introduces electromagnetic waves (microwaves) into the processing container 101 to generate plasma. The microwave introduction device 105 includes the ceiling wall 111 of the processing container 101, a microwave output part 130, and an antenna unit 140. The ceiling wall 111 may serve as a ceiling plate. The microwave output part 130 generates microwaves and distributes and outputs the microwaves to a plurality of paths. The frequency of microwaves in the range of 700 MHz to 10 GHz, such as 860 MHz, 2.45 GHZ, 8.35 GHZ, 5.8 GHZ, or 1.98 GHz, may be used. The antenna unit 140 introduces the microwaves output from the microwave output part 130 into the processing container 101.

The antenna unit 140 includes a plurality of (three in the example of FIG. 17) antenna modules. Each of the antenna modules introduces the microwaves distributed by the microwave output part 130 into the processing container 101. The configurations of the plurality of antenna modules are all the same. Each antenna module includes an amplifier 142 configured mainly to amplify and output the distributed microwaves, and a microwave radiation mechanism 143 configured to radiate, into the processing container 101, the microwaves output from the amplifier 142.

The controller 106 is a computer including a processor, a storage, an input/output device, and the like, and controls each part of the film forming apparatus 100.

The controller 106 operates according to a computer program (e.g., a program based on an input recipe) for controlling each part of the film forming apparatus 100 in each step of the film forming method according to an embodiment, and outputs control signals. Each part of the film forming apparatus 100 is controlled by control signals from the controller 106. Specifically, in the film forming apparatus 100 illustrated in FIG. 17, by using the control signals, the controller 106 is capable of controlling the selection and flow rate of a gas supplied from the gas source 192 or the like, exhaust of the exhaust device 104, microwave output from the microwave output part 130, or the like. Each step of the film forming method disclosed herein may be performed by operating each part of the film forming apparatus 100 under the control of the controller 106. The storage of the controller 106 stores a computer program for performing a film forming method according to an embodiment and various data used for performing the film forming method in a readable state.

Another Example of Film Forming Apparatus According to One Embodiment

Figure 18:
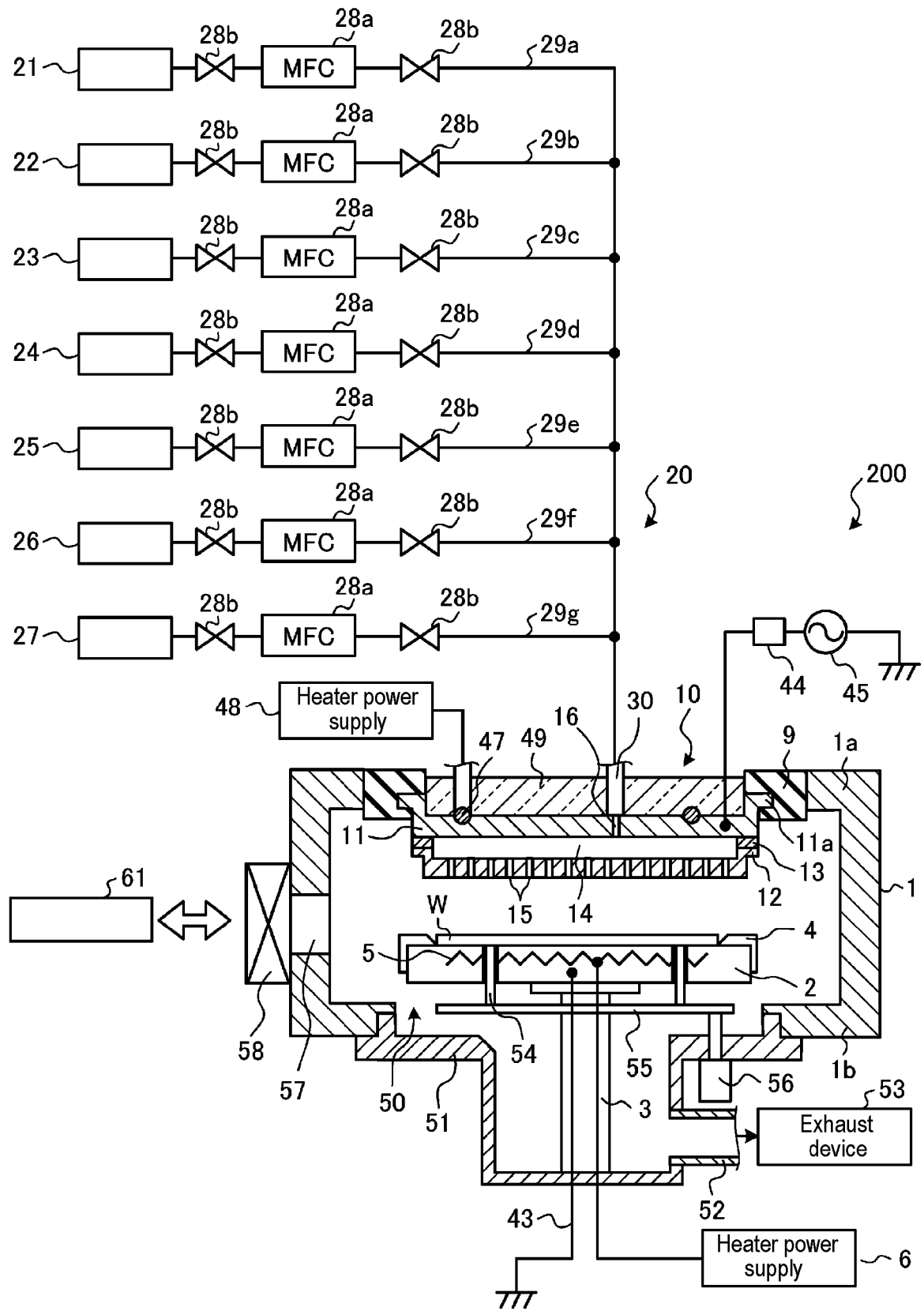
FIG. 18 is a view illustrating another example of a film forming apparatus for performing a film forming method according to an embodiment.

FIG. 18 is a view illustrating another example of a film forming apparatus for performing a film forming method according to an embodiment. The film forming apparatus 200 illustrated in FIG. 18 includes a substantially cylindrical processing container 1. A susceptor 2 is arranged inside the processing container 1 in the state of being supported by a cylindrical support member 3 provided in the lower central portion thereof. The susceptor 2 is a stage configured to horizontally support a substrate W, and is made of, for example, a ceramic material such as aluminum nitride (AlN), or a metal material such as aluminum or a nickel alloy.

A guide ring 4 configured to guide a substrate W is provided on the outer edge of the susceptor 2. A heater 5 made of a high melting point metal such as molybdenum is embedded in the susceptor 2. The heater 5 heats the substrate W supported by the susceptor 2 to a predetermined temperature by being supplied with power from a heater power supply 6.

A shower head 10 is provided on the ceiling wall 1a of the processing container 1 via an insulating member 9. The shower head 10 is a premix-type shower head and includes a base member 11 and a shower plate 12.

The outer peripheral portion of the shower plate 12 of the shower head 10 is fixed to the base member 11 via an annular intermediate member 13 for preventing sticking.

The shower plate 12 has a flange shape, and a recess is formed inside the shower plate 12. That is, a gas diffusion space 14 is formed between the base member 11 and the shower plate 12. A flange 11a is formed in the outer peripheral portion of the base member 11, and the flange 11a is supported by the insulating member 9.

A plurality of gas ejection holes 15 are formed in the shower plate 12, and one gas introduction hole 16 is formed near the center of base member 11. This gas introduction hole 16 is connected to the gas line of the gas supply mechanism 20.

The gas supply mechanism 20 includes gas sources 21 to 27. The gas source 21 supplies toluene ($C_6H_5CH_3$) as an aromatic hydrocarbon gas, which is a precursor gas for a graphene film. The gas source 22 supplies aniline ($C_6H_5NH_2$) as an aromatic hydrocarbon gas, which is a precursor gas for a graphene film. The gas source 23 supplies dichlorobenzene ($C_6H_4Cl_2$) as an aromatic hydrocarbon gas, which is a precursor gas for a graphene film. The gas source 24 supplies argon (Ar) as a rare gas, which is a reaction gas for plasma generation. The gas source 25 supplies hydrogen ($H_2$) as a reducing gas. The gas source 26 supplies nitrogen ($N_2$) or ammonia ($NH_3$) as a nitrogen-containing gas used as a purge gas or a gas for forming adsorption sites. The gas source 27 supplies acetylene ($C_2H_2$) as a carbon-containing gas that contributes as a bond component of C—C bonds.

Gas supply lines 29a to 29g are connected to the gas sources 21 to 27, respectively. Each gas line is provided with two valves 28b with a mass flow controller (MFC) 28a interposed therebetween. Each gas line is connected to the gas introduction hole 16 via a gas pipe 30. The gas supplied to the gas introduction hole 16 reaches the gas diffusion space 14 through the gas introduction hole 16 and is ejected toward the substrate W in the processing container 1 through the gas ejection holes 15 in the shower plate 12.

A radio-frequency power supply 45 is connected to the shower head 10 via a matcher 44. The radio-frequency power supply 45 supplies radio-frequency power for plasma generation to the shower head 10. The shower head 10 also functions as the upper electrode of parallel plate electrodes.

On the other hand, the susceptor 2 functions as a lower electrode of the parallel plate electrodes. The susceptor 2 is grounded via a transmission line 43.

The base member 11 of the shower head 10 is provided with a heater 47. The heater 47 is supplied with power from a heater power supply 48, and heats the shower head 10 to a desired temperature. A heat insulating member 49 is provided in the recess formed in the upper portion of the base member 11.

A circular hole 50 is formed in the central portion of the bottom wall 1b of the processing container 1. The bottom wall 1b is also provided with an exhaust chamber 51 protruding downward to cover the hole 50. An exhaust pipe 52 is connected to the side surface of the exhaust chamber 51, and an exhaust device 53 is connected to the exhaust pipe 52.

By operating the exhaust device 53, it is possible to depressurize the interior of the processing container 1 to a predetermined degree of vacuum.

The susceptor 2 is provided with a plurality of (e.g., three) support pins 54 configured to support and lift the substrate W. The plurality of support pins 54 is provided to protrude or retract with respect to the surface of the susceptor 2 and is supported by a support plate 55. The support pin 54 is configured to be raised and lowered via the support plate 55 by a driving mechanism 56.

On the side wall of the processing container 1, a carry-in/out port 57 configured to perform carry-in/out of a substrate W to and from a transport chamber (not illustrated) provided adjacent to the processing container 1, and a gate value 58 configured to open/close the carry-in/out port 57.

The film forming apparatus 200 also includes a controller 61. The controller 61 is a computer including a processor, a storage, an input/output device, and the like, and controls each part of the film forming apparatus 200.

The controller 61 operates according to a computer program (e.g., a program based on an input recipe) for controlling each part of the film forming apparatus 200 in each step of the film forming method according to an embodiment, and outputs control signals. Each part of the film forming apparatus 200 is controlled by control signals from the controller 61. Specifically, in the film forming apparatus 200 illustrated in FIG. 18, by using the control signals, the controller 61 is capable of controlling the selection and flow rate of a gas supplied from the gas source 21 or the like, exhaust of the exhaust device 53, power supply from the radio-frequency power supply 45, or the like. Each step of the film forming method disclosed herein may be performed by operating each part of the film forming apparatus 200 under the control of the controller 106. The storage of the controller 106 stores a computer program for performing a film forming method according to an embodiment and various data used for performing the film forming method in a readable state.

Effect of Embodiment

The film forming method according to the above-described embodiment includes a first step and a second step. In the first step, a first aromatic hydrocarbon gas having a first functional group is supplied to a substrate provided with an underlayer film. In the second step, the first aromatic hydrocarbon gas adsorbed on the surface of the underlayer film is activated by plasma of a first reaction gas containing at least a rare gas. Therefore, according to the embodiment, it is possible to efficiently form a carbon film (graphene film) even in a low-temperature environment.

In the film forming method according to the embodiment, in the second step, a C—C bond is formed starting from a position where the first functional group is detached from the activated first aromatic hydrocarbon gas. Therefore, according to the embodiment, with the detachment of the functional group as a trigger, the connection of six-membered rings of carbon atoms contained in the first aromatic hydrocarbon gas can be initiated.

In the film forming method according to the embodiment, the first step and the second step are repeatedly performed a predetermined number of times. Therefore, according to the embodiment, even if the film thickness of the carbon film (graphene film) does not reach a desired film thickness in one process, it is possible to achieve a desired film thickness by repeatedly performing the process.

In the film forming method according to the embodiment, the first aromatic hydrocarbon gas is at least one aromatic hydrocarbon gas selected from toluene, aniline, and dichlorobenzene. Therefore, according to the embodiment, it is possible to promote the growth of the carbon film (graphene film) by causing the six-membered rings of carbon atoms contained in a single aromatic hydrocarbon gas to be connected.

In the film forming method according to the embodiment, the first reaction gas may be a gas containing a rare gas and a carbon-containing gas. Therefore, according to the embodiment, it is possible to use a carbon-containing gas as a bond component that connects six-membered rings of carbon atoms.

In the film forming method according to the embodiment, the first reaction gas may further include a hydrogen-containing gas. Therefore, according to the embodiment, it is possible to use the hydrogen-containing gas as an etching component for the carbon film (graphene film), and to adjust the growth rate of the carbon film (graphene film).

In addition, the film forming method according to the embodiment further includes a third step of supplying a second aromatic hydrocarbon gas having a second functional group to the substrate after the first step and before the second step. In the second step, the first aromatic hydrocarbon gas and the second aromatic hydrocarbon gas adsorbed on the surface of the underlayer film are activated by the plasma of the first reaction gas. Therefore, according to the embodiment, it is possible to increase the number of starting positions for forming C—C bonds, and as a result, it is possible to more efficiently form a graphene film.

In the film forming method according to the embodiment, in the second step, the C—C bonds may be formed starting from the positions at which the first and second functional groups are detached from the activated first and second aromatic hydrocarbon gases. For this reason, according to the embodiment, with the detachment of the functional groups as a trigger, the connection of six-membered rings of carbon atoms contained in the first and second aromatic hydrocarbon gases may be initiated.

In the film forming method according to the embodiment, the second aromatic hydrocarbon gas may be at least one aromatic carbon gas selected from toluene, aniline, and dichlorobenzene, and may be an aromatic hydrocarbon gas different from the first aromatic hydrocarbon gas. Therefore, according to the embodiment, it is possible to promote the growth of the carbon film (graphene film) by causing the six-membered rings of carbon atoms contained in two types of aromatic hydrocarbon gases to be connected.

The film forming method according to the embodiment may further include a fourth step of further activating the first and second aromatic hydrocarbon gases adsorbed on the surface of the underlayer film by plasma of a second reaction gas containing at least a rare gas after the second step. Therefore, according to the embodiment, it is possible to reinforce unstable C—C bonds in the carbon film (graphene film), and as a result, it is possible to stabilize the structure of the carbon film (graphene film).

The film forming method according to the embodiment may further include a fifth step of forming adsorption sites capable of adsorbing the first aromatic hydrocarbon gas on the surface of the underlayer film by supplying a nitrogen-containing gas to the substrate before the first step. Therefore, according to the embodiment, it is possible to increase the adsorption amount of the precursor to the surface of the underlayer film, and as a result, it is possible to stably form the carbon film (graphene film).

In the film forming method according to the embodiment, the temperature of the substrate in the first step and the second step may be maintained within a range of 25 to 550 degrees C. Therefore, according to the embodiment, even in a low-temperature environment in which the temperature of the substrate is maintained within the range of 25 to 550 degrees C., it is possible to efficiently form the carbon film (graphene film).

In the film forming method according to the embodiment, the plasma in the second and fourth steps may be generated by using microwaves or capacitively coupled plasma. Therefore, according to the embodiment, it is possible to reduce damage to the formed carbon film (graphene film) by suppressing the energy of ions in the generated plasma.

It shall be understood that respective embodiments disclosed herein are exemplary in all respects and not restrictive. The embodiments described above may be omitted, replaced, or modified in various forms without departing from the scope and spirit of the appended claims.

EXPLANATION OF REFERENCE NUMERALS

100: film forming apparatus, 101: processing container, 102: stage, 106: controller, 302, 352: underlayer film, 303, 353: graphene film, W: substrate

What is claimed is:

1. A film forming method comprising:
an initial step of supplying a nitrogen-containing gas to a substrate provided with an underlayer film to form an adsorption site on a surface of the underlayer film;
a first step of supplying a first aromatic hydrocarbon gas having a first functional group to the substrate to adsorb the first aromatic hydrocarbon gas on the adsorption site;
a second step of activating the first aromatic hydrocarbon gas adsorbed on the adsorption site formed on the surface of the underlayer film by plasma of a first reaction gas that contains at least a rare gas, and
a third step of supplying a second aromatic hydrocarbon gas having a second functional group to the substrate after the first step and before the second step,
wherein, in the second step, the plasma of the first reaction gas activates the first aromatic hydrocarbon gas and the second aromatic hydrocarbon gas adsorbed on the adsorption site formed on the surface of the underlayer film,
wherein the second aromatic hydrocarbon gas is an aromatic hydrocarbon gas different from the first aromatic hydrocarbon gas, and
wherein the first reaction gas is a gas containing the rare gas and an acetylene gas.

2. The film forming method of claim 1, wherein, in the second step, C—C bonds are formed starting from positions where the first functional group and the second functional group are detached from the activated first aromatic hydrocarbon gas and the second aromatic hydrocarbon gas, respectively.

3. The film forming method of claim 2, wherein the first step to the second step are repeatedly performed a predetermined number of times.

4. The film forming method of claim 3, wherein the first aromatic hydrocarbon gas is at least one aromatic hydrocarbon gas selected from toluene, aniline, and dichlorobenzene.

5. The film forming method of claim 1, wherein the first reaction gas further contains a hydrogen-containing gas.

6. The film forming method of claim 5, wherein the second aromatic hydrocarbon gas is at least one aromatic carbon gas selected from toluene, aniline, and dichlorobenzene.

7. The film forming method of claim 5, further comprising:
a fourth step of further activating the first aromatic hydrocarbon gas and the second aromatic hydrocarbon gas adsorbed on the adsorption site formed on the surface of the underlayer film by plasma of a second reaction gas containing at least a rare gas, after the second step.

8. The film forming method of claim 7, wherein the plasma in the second step and the fourth step is generated using microwaves or capacitive coupling.

9. The film forming method of claim 1, wherein the first step to the second step are repeatedly performed a predetermined number of times.

10. The film forming method of claim 1, wherein the first aromatic hydrocarbon gas is at least one aromatic hydrocarbon gas selected from toluene, aniline, and dichlorobenzene.

11. The film forming method of claim 1, wherein, when the first step to the second step are repeatedly performed a predetermined number of times, the initial step is performed each time the repetition of the first step to the second step is completed.

12. The film forming method of claim 1, wherein a temperature of the substrate in the first step to the second step is maintained within a range of 25 to 550 degrees C.

13. A film forming apparatus comprising:
a processing container configured to accommodate a substrate provided with an underlayer film;
a gas supply configured to supply gases into the processing container;
an exhauster configured to exhaust an interior of the processing container;
a microwave introduction device configured to generate microwaves for generating plasma and including a microwave output part and an antenna; and
a controller configured to control the processing container, the gas supply, the exhauster, and the microwave introduction device to perform:
an initial step of supplying a nitrogen-containing gas to the substrate to form an adsorption site on a surface of the underlayer film;
a first step of supplying a first aromatic hydrocarbon gas having a first functional group to the substrate to adsorb the first aromatic hydrocarbon gas on the adsorption site;
a second step of activating the first aromatic hydrocarbon gas adsorbed on the adsorption site formed on the surface of the underlayer film by plasma of a first reaction gas that contains at least a rare gas; and
a third step of supplying a second aromatic hydrocarbon gas having a second functional group to the substrate after the first step and before the second step,
wherein, in the second step, the plasma of the first reaction gas activates the first aromatic hydrocarbon gas and the second aromatic hydrocarbon gas adsorbed on the adsorption site formed on the surface of the underlayer film, wherein the second aromatic hydrocarbon gas is an aromatic hydrocarbon gas different from the first aromatic hydrocarbon gas, and wherein the first reaction gas is a gas containing the rare gas and an acetylene gas.

* * * * *